（12）United States Patent
Premendra (10) Patent No.: US 9,093,251 B2
(45) Date of Patent: Jul. 28, 2015

(54) SPUTTERING MAGNETRON ASSEMBLY

(75) Inventor: Premendra, Ahmedabad (IN)

(73) Assignee: TOYOTA MOTOR EUROPE NV/SA, Brussels (BE)

( * ) Notice: Subject to any disclaimer, the term of this patent is extended or adjusted under 35 U.S.C. 154(b) by 114 days.

(21) Appl. No.: 13/266,012

(22) PCT Filed: Feb. 18, 2011

(86) PCT No.: PCT/EP2011/052472

§ 371 (c)(1),
(2), (4) Date: Oct. 24, 2011

(87) PCT Pub. No.: WO2012/110105

PCT Pub. Date: Aug. 23, 2012

(65) Prior Publication Data

US 2012/0211352 A1      Aug. 23, 2012

(51) Int. Cl.
*H01J 37/34*      (2006.01)
(52) U.S. Cl.
CPC ........... *H01J 37/3405* (2013.01); *H01J 37/342* (2013.01); *H01J 37/3452* (2013.01); *H01J 37/3455* (2013.01)
(58) Field of Classification Search
CPC .............. H01J 37/3405; H01J 37/3452; H01J 37/3455; H01J 37/342
USPC .............. 204/192.12, 298.21, 298.22, 298.11
See application file for complete search history.

(56) References Cited

U.S. PATENT DOCUMENTS

| 4,426,264 | A   | * | 1/1984 | Munz et al. ............... 204/192.13 |
| 7,674,360 | B2  |   | 3/2010 | Hong et al. |
| 2004/0129561 | A1 |   | 7/2004 | Barrett et al. |
| 2004/0178056 | A1 |   | 9/2004 | De Bosscher et al. |
| 2006/0000705 | A1 |   | 1/2006 | Hartig et al. |
| 2008/0047831 | A1 | * | 2/2008 | Richert et al. ........... 204/298.12 |
| 2010/0126852 | A1 |   | 5/2010 | Ohmi et al. |
| 2010/0155226 | A1 |   | 6/2010 | Madocks et al. |

FOREIGN PATENT DOCUMENTS

WO          02/34669 A1     5/2002

OTHER PUBLICATIONS

International Search Report mailed May 24, 2011 of PCT/EP2011/052472 & Written Opinion.

* cited by examiner

*Primary Examiner* — Rodney McDonald
(74) *Attorney, Agent, or Firm* — Kenyon & Kenyon LLP (57) ABSTRACT

The present invention concerns a sputtering magnetron assembly comprising a rotatable tubular target cathode and a magnetic field generating device installed within the tubular target cathode. At least part of the magnetic field generating device is configured to move within the tubular target cathode so as to maintain within a predetermined range a magnetic field strength at an outer surface of the tubular target cathode during erosion of said outer surface. The present invention also relates to a physical vapour deposition method using such a sputtering magnetron assembly.

8 Claims, 10 Drawing Sheets

SPUTTERING MAGNETRON ASSEMBLY

This is a 371 national phase application of PCT/EP2011/052472 filed 18 Feb. 2011, the contents of which are incorporated herein by reference.

TECHNICAL FIELD

The present specification relates to a sputtering magnetron assembly and to the use of a sputtering magnetron assembly in a physical vapor deposition (PVD) process.

BACKGROUND

The term <<physical vapor deposition>> (PVD) covers a variety of methods for depositing a thin film of material by condensation of a vaporized form of the material on a substrate, involving physical processes rather than a chemical reaction at the surface of the substrate. One such PVD method is known as sputtering. In sputtering, plasma ions bombard a sacrificial target cathode, or sputtering source, ejecting from this target particles of the material to be deposited on the substrate, together with secondary electrons. These secondary electrons also generate more plasma ions by non-elastic collisions.

In order to increase the yield of the sputtering source, it is known to generate a magnetic field at the surface of the target. In a so-called sputtering magnetron assembly, a magnetic field generating device is located behind the target cathode. In magnetron sputtering, the secondary electrons ejected from the target are subject to a Lorentz force which puts them on a path substantially parallel to the surface of the target. Consequently, the secondary electrons generate more plasma ions close to the target, and this denser plasma increases the yield of particles sputtered from the bombarded surface of the target cathode.

The ejection of sputtered particles from the target cathode, however, causes a gradual erosion of the target cathode, localized by the magnetic field on specific areas of the target cathode. However, because of this gradual erosion and retreat of the exposed surface of the target cathode, the magnetic field at this surface will change, and with it the characteristics of the thin film being deposited. For planar target cathodes, it has thus been proposed, for instance in U.S. Pat. No. 7,674,360, to move the magnetic field generator perpendicularly to the plane of the target cathode in order to maintain the magnetic field strength at the opposite surface of the target cathode, as this opposite surface is being eroded.

To prevent an unequal wear of the target surface, sputtering magnetron assemblies with rotatable tubular target cathodes have also been introduced, wherein the magnetic field generating device is installed within the rotatable tubular target cathode, which thus rotates around the magnetic field generating device ensuring a circumferentially regular erosion of the outer surface of the tubular target cathode bombarded by the plasma. It has also been proposed, for instance in US Patent Application Publication US 2010/0155226 A1, to additionally move the tubular target cathode axially, in order to ensure a regular erosion of the outer surface of the tubular target cathode also in the longitudinal direction. It has also been proposed in US Patent Application Publication US 2004/0178056 A1 to adjust a position of the magnetic field generating device to vary the magnetic field strength or the induction of a plasma racetrack across the eroding outer surface of the tubular target cathode.

However, because of the decreasing outer perimeter of the tubular target cathode as its outer surface is eroded, the magnetic field strength at the outer surface will gradually change. This will affect, for instance, the yield in sputter particles and the composition of the deposited thin film. In order to maintain the magnetic field strength at the outer surface of the tubular target cathode within a predetermined range, it has thus been necessary to frequently replace the tubular target cathode.

SUMMARY

An object of the present specification is that of reducing the maintenance cost and downtime of a sputtering magnetron assembly with a rotating tubular target cathode and a magnetic field generating device, installed within the tubular target cathode.

Therefore, according to a first aspect of the specification, at least part of the magnetic field generating device is configured to move within the tubular target cathode so as to maintain within a predetermined range a magnetic field strength at an outer surface of the tubular target cathode during erosion of said outer surface.

Consequently, the tubular target cathode has to be less frequently replaced, reducing the maintenance cost and downtime of the sputtering magnetron assembly while reliably maintaining the parameters of the particles sputtered by the sputtering magnetron assembly.

According to a further aspect of the specification, the magnetic field generating device may comprise a plurality of magnets and a magnetic shield interposed between the plurality of magnets and an inner surface of the tubular target cathode, wherein the plurality of magnets and the magnetic shield are configured to move relatively to each other so as to successively align with a window in said magnetic shield different magnets of the plurality of magnets. Therefore, different magnets of the plurality of magnets are successively aligned with the window in the magnetic shield to maintain within a predetermined range the magnetic field strength at the eroding outer surface of the tubular target cathode.

In particular, magnets of the plurality of magnets may be at different distances from a center axis of the tubular target cathode, so that the successive alignment of these different magnets with the window in the magnetic field varies the magnetic field around the magnetic field generating device. To the same effect, alternatively or simultaneously, magnets of the plurality of magnets may have magnetic moments of different magnitudes.

In either case, in order to arrange the plurality of magnets in a particularly compact manner within the tubular target cathode, the magnets of the plurality of magnets may be arranged radially around a center axis and the plurality of magnets be configured to rotate relatively to the magnetic shield so as to successively align with the window different magnets of the plurality of magnets. However, alternative arrangements of the plurality of magnets, and movements for successively aligning them with the magnetic shield window can also be considered.

In yet another aspect of the present specification, the magnetic field generating device may be configured to move in a radial direction with respect to the center axis of the tubular target cathode.

The present specification also relates to a physical vapor deposition process using a sputtering magnetron assembly comprising a rotatable tubular target cathode and, within the tubular target cathode, a magnetic field generating device, wherein at least part of the magnetic field generating device moves within the tubular target cathode to maintain within a predetermined range a magnetic field strength at an outer surface of the tubular target cathode during erosion of said outer surface.

The above summary of some aspects of the present specification is not intended to describe each disclosed embodiment or every implementation of the invention. In particular, selected features of any illustrative embodiment within this specification may be combined with selected features of at other embodiments or incorporated into an additional embodiment unless clearly stated to the contrary.

BRIEF DESCRIPTION OF THE DRAWINGS

The invention may be more completely understood in consideration of the following detailed description of various embodiments in connection with the accompanying drawings, in which.

While the invention is amenable to various modifications and alternative forms, specifics thereof have been shown by way of example in the drawings and will be described in detail. It should be understood, however, that the intention is not to limit aspects of the invention to the particular embodiments described. On the contrary, the intention is to cover all modifications, equivalents, and alternatives falling within the scope of the invention.

DETAILED DESCRIPTION

For the following defined terms, these definitions shall be applied, unless a different definition is given in the claims or elsewhere in this specification.

All numeric values are herein assumed to be preceded by the term "about", whether or not explicitly indicated. The term "about" generally refers to a range of numbers that one of skill in the art would consider equivalent to the recited value (i.e. having the same function or result). In many instances, the term "about" may be indicative as including numbers that are rounded to the nearest significant figure.

Although some suitable dimension ranges and/or values pertaining to various components, features and/or specifications are disclosed, one of skill in the art, incited by the present disclosure, would understand desired dimensions, ranges and/or values may deviate from those expressly disclosed.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment or combined with each other unless clearly stated to the contrary.

Figure 1:
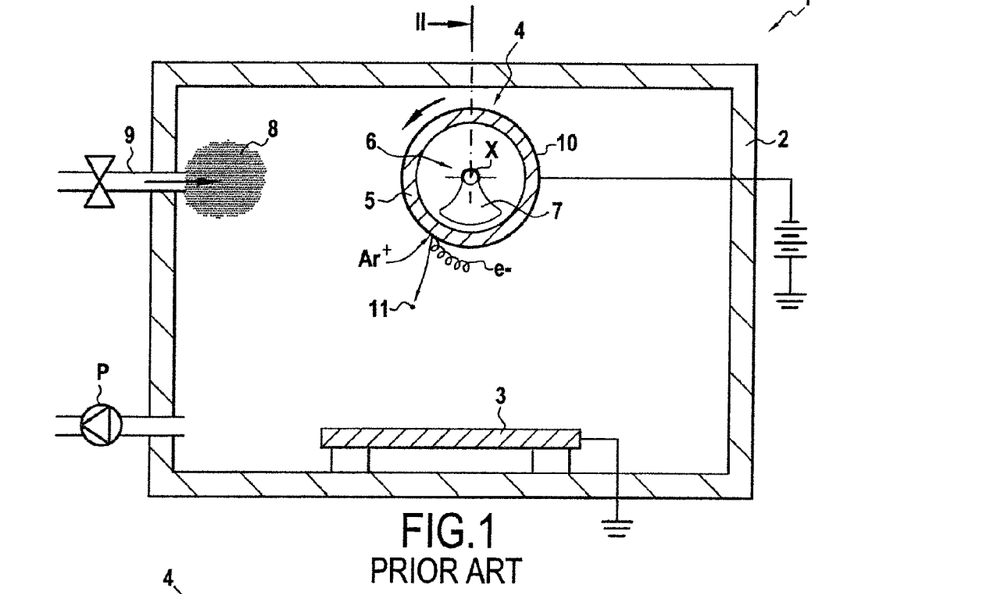
FIG. 1 shows a schematic cross-section of a prior art physical vapor deposition system with a sputtering magnetron assembly.

For comparative purposes, a prior art physical vapour deposition (PVD) system 1 is illustrated in FIG. 1. This PVD system 1 comprises a vacuum chamber 2 containing a workpiece 3, and a sputtering magnetron assembly 4. The sputtering magnetron assembly 4 in turn comprises a sacrificial tubular target cathode 5 and, within this sacrificial tubular target cathode 5, a magnetic field generating device 6 comprising a magnet 7. In use, an inert gas 8 (argon in this example, although other inert gases may be used instead) is introduced at very low pressure (typically at an order of magnitude of 10 Pa) through an input 9 into the vacuum chamber 2, while the tubular target cathode 5 is put under a negative voltage (typically at least −300 V). Because of the electric field in the PVD system 1, positive ions $Ar^+$ in the low-pressure inert gas 8 are attracted towards the tubular target cathode 5, impacting against its outer surface 10. When a positive ion $Ar^+$ collides with surface atoms of the tubular target cathode 5, it transfers to them at least part of its kinetic energy. This energy is in turn transmitted to neighboring surface atoms and can normally eject an atom 11 from the surface 10 when the energy transmitted to this atom 11 in a direction normal to the surface is larger than about three times the surface binding energy of the material of the tubular target cathode 5, which is approximately equal to its sublimation heat. The thus sputtered atoms 11 fly through the vacuum chamber 2 to deposit themselves on the surface of workpiece 3, which forms a substrate to the film thus deposited.

In addition to the sputtered atoms 11, the collision of positive ions $Ar^+$ against the surface 10 also ejects so-called secondary electrons $e^-$. As illustrated in particular in FIG. 2A, these secondary electrons $e^-$ will be directed by the magnetic field generated by the magnetic field generating device 6 into spiral trajectories 12 around magnetic field lines 13. As these are oriented approximately parallel to the surface 10, the secondary electrons e⁻ remain close to the surface 10, increasing the likelihood of a ionizing collision with an atom of the inert gas 8. This maintains thus a glow discharge and plasma (not shown) in the proximity of the sputtering magnetron assembly 4, despite the low pressure, bombarding the surface 10 with further positive ions Ar⁺.

Figure 2A:
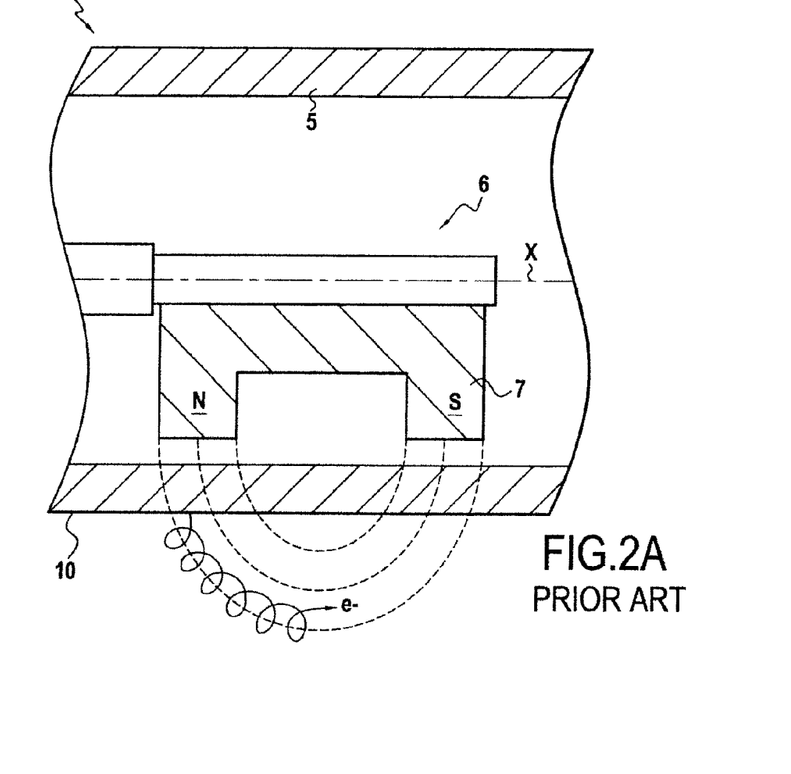
FIGS. 2A and 2B show schematically the magnetic flow at the outer surface of the sputtering magnetron assembly of FIG. 1 at two different stages in the physical vapor deposition process.
Figure 2B:
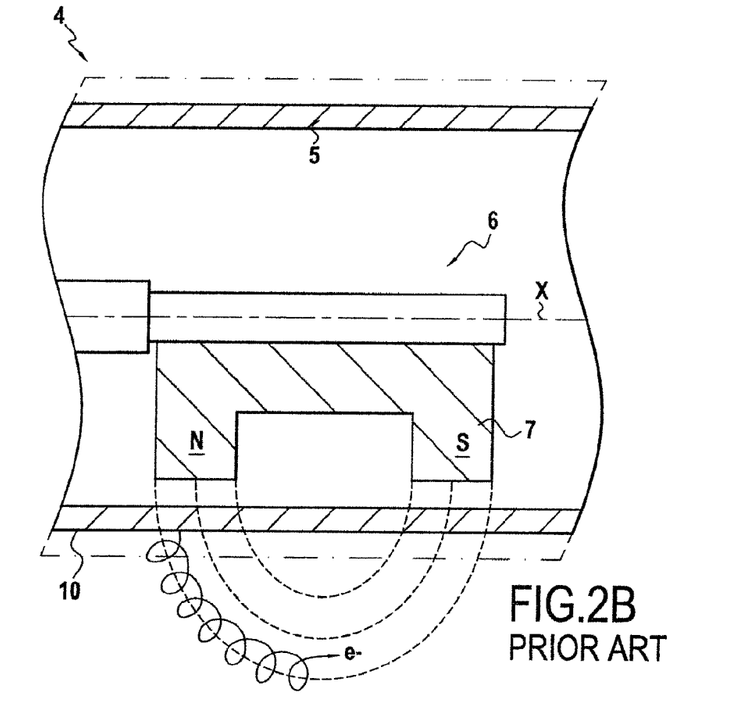
Figure 3:
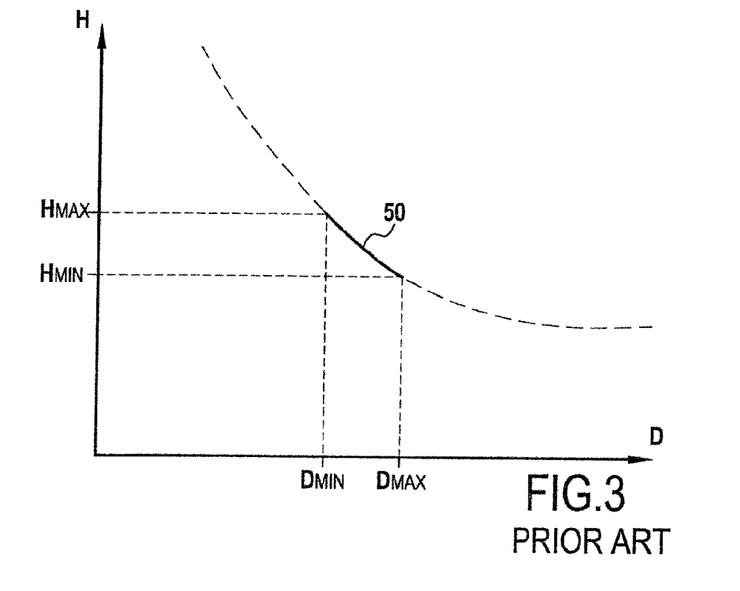
FIG. 3 shows a graph of the magnetic field strength at an outer surface of a rotating tubular target cathode of the prior art sputtering magnetron assembly of FIG. 1.

Sputtering progressively erodes the surface 10. To ensure that this erosion is homogeneous around the tubular target cathode 5, it is made to rotate around its main axis X. However, as can be seen in FIGS. 2A and 2B, this gradual erosion will change the magnetic field strength at the surface 10 as its diameter D decreases. This in turn will progressively alter the interactions between the surface 10, the plasma 14 and the secondary electrons e⁻. As illustrated in FIG. 3, to maintain predetermined sputter parameters, the magnetic field strength H at the surface 10 must remain within a relatively narrow range between a minimum magnetic field strength $H_{min}$ and a maximum magnetic field strength $H_{max}$. However, as the magnetic field strength H at the surface 10 increases as the outer diameter D of the tubular target cathode 5 decreases, only a comparatively narrow thickness of the tubular target cathode 5 can be used between a maximum diameter $D_{max}$ and a minimum diameter $D_{min}$ at which the curve 50 of the magnetic field strength H at the surface 10 intersects the two extremes of the range of allowable magnetic field strengths H. Consequently, the tubular target cathode 5 must be replaced at frequent intervals, increasing both the maintenance cost and downtime of the PVD system 1.

Figure 4A:
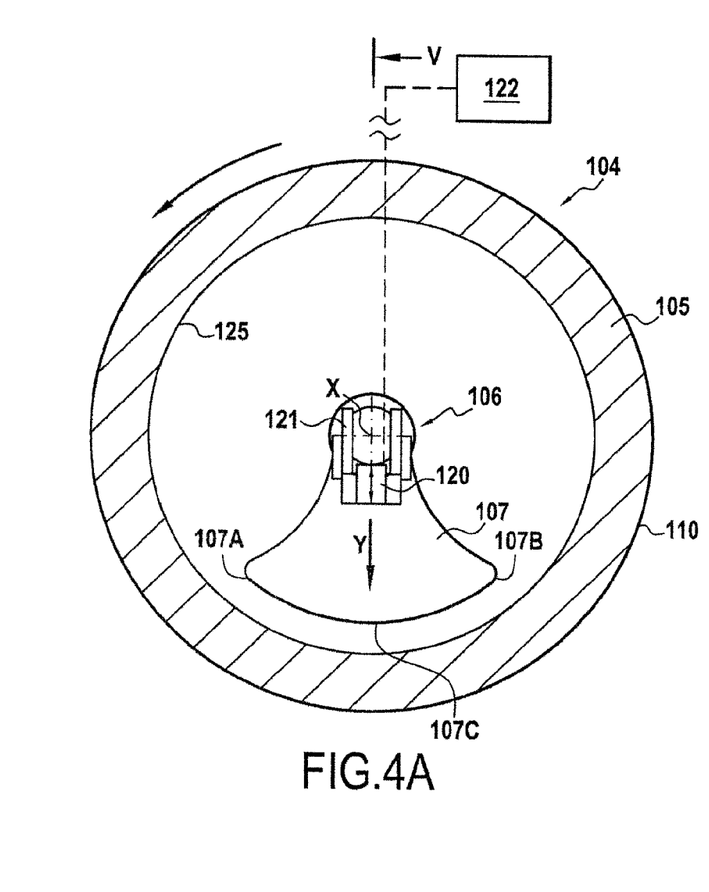
FIGS. 4A and 4B show a schematic cross-section of a sputtering magnetron assembly according to a first embodiment at two different stages in the physical vapor deposition process.
Figure 4B:
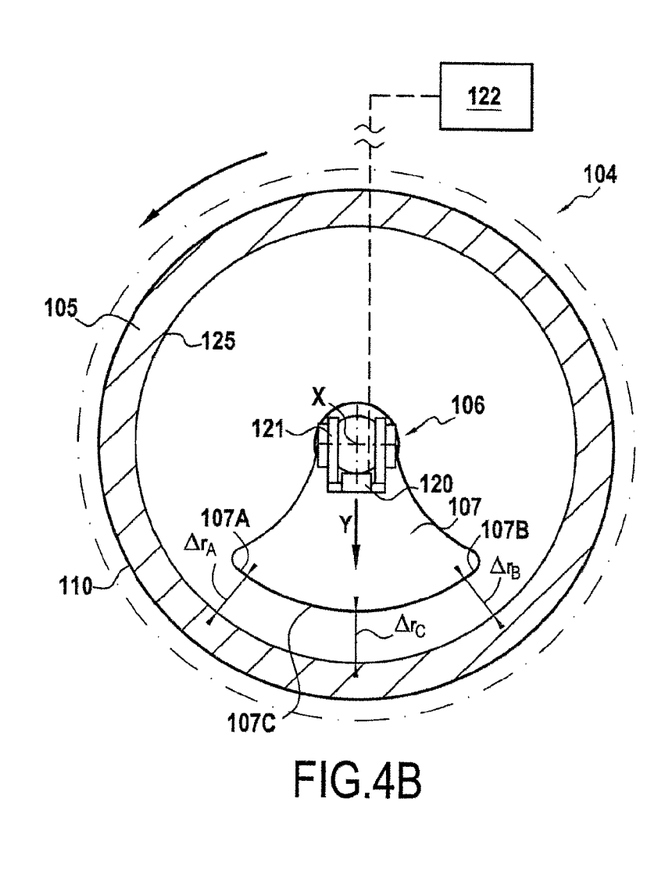

In a first embodiment, as first illustrated in FIG. 4A, a sputtering magnetron assembly 104 also comprises a rotatable sacrificial tubular target cathode 105 and, within this tubular target cathode 105, a magnetic field generating device 106 comprising a magnet 107. However, the magnetic field generating device 106 also comprises a linear actuator 120 and guides 121 installed so as to move at least the magnet 107 in a radial direction Y perpendicularly to the main axis X of the tubular target cathode 105. The linear actuator 120, which can be, for example, a fluidic or an electric actuator, or comprise, for example, a leadscrew or a rack-and-pinion gearing to convert a rotational motion into a linear motion, is connected to a control unit 122 which, over this linear actuator 120, commands a radial motion of at least the magnet 107, moving at least the magnet 107 radially inwardly, as can be seen in FIG. 4B.

Figure 6:
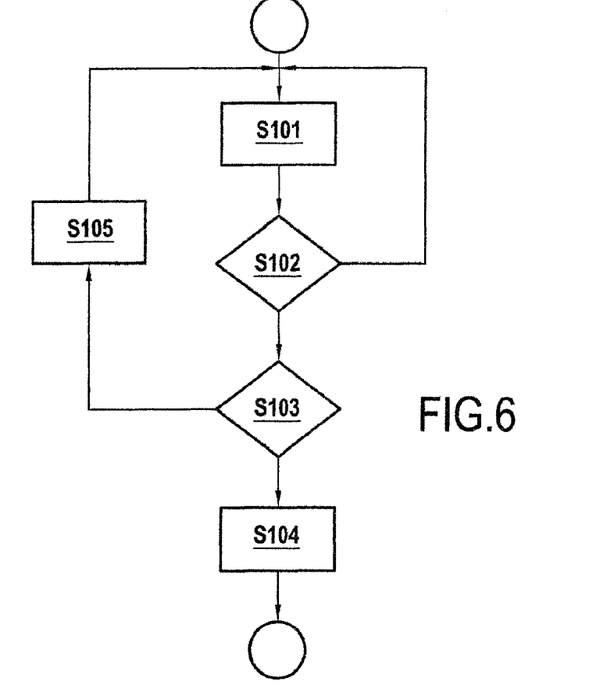
FIG. 6 shows a flowchart of a method for controlling the sputtering magnetron assemblies of the first embodiment.

The inward motion of the magnet 107 is commanded by the control unit 122, so as to at least partially compensate the gradual erosion of the outer surface 110 and the reduction of its diameter D. An example of a control method that can be applied is illustrated in FIG. 6. In a first step S101, the magnetic field strength H at the outer surface 110 of the cathode 105 is estimated based on the current diameter of the outer surface 110. This current diameter can be directly measured, indirectly measured or estimated.

To directly measure the current diameter, non-contact means can be used, such as, for example, a laser focused on the outer surface 110, with a sensor for detecting the reflection of the laser. A displacement of the laser reflection indicates the retreat of the outer surface and corresponding reduction in diameter. To indirectly measure the current diameter, the current weight of the cathode 105 can be measured, and the weight loss translated into a reduction in diameter of its outer surface 110. Finally, the current diameter can also be estimated, for example based of the sputtering time and power, from which the weight loss of the cathode 105 and reduction in diameter of its outer surface 110 may be inferred.

In the next step S102, the magnetic field strength H is compared with the maximum allowable magnetic field strength $H_{max}$. If the magnetic field strength H is lower than the maximum allowable magnetic field strength $H_{max}$, the control unit 122 loops back to the first step S101. However, if the magnetic field strength H is equal to or higher than said maximum allowable magnetic field strength $H_{max}$, the next step is step S103 in which, in this embodiment, it is checked whether the magnet 107 is still beyond a predetermined distance of an end stop in the radially inward direction. In this case, a signal for replacing the tubular target cathode 105 will be issued in the next step S104, before stopping the PVD process. On the other hand, if the actuator 120 is not yet within said predetermined distance of the end stop, in step S105 the control unit 122 issues a command to move the magnet 107 inwardly by said predetermined distance. The control unit 122 then loops back to the first step S100.

Figure 5A:
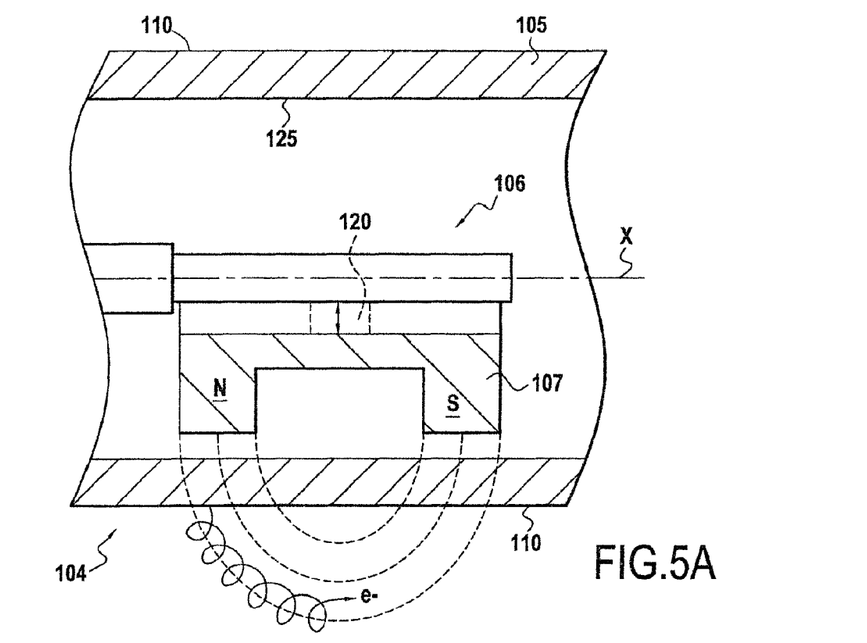
FIGS. 5A and 5B show a schematic partial longitudinal section, along line V, of the sputtering magnetron assembly according to the first embodiment, in the positions, respectively, of FIG. 4A and FIG. 4B.
Figure 5B:
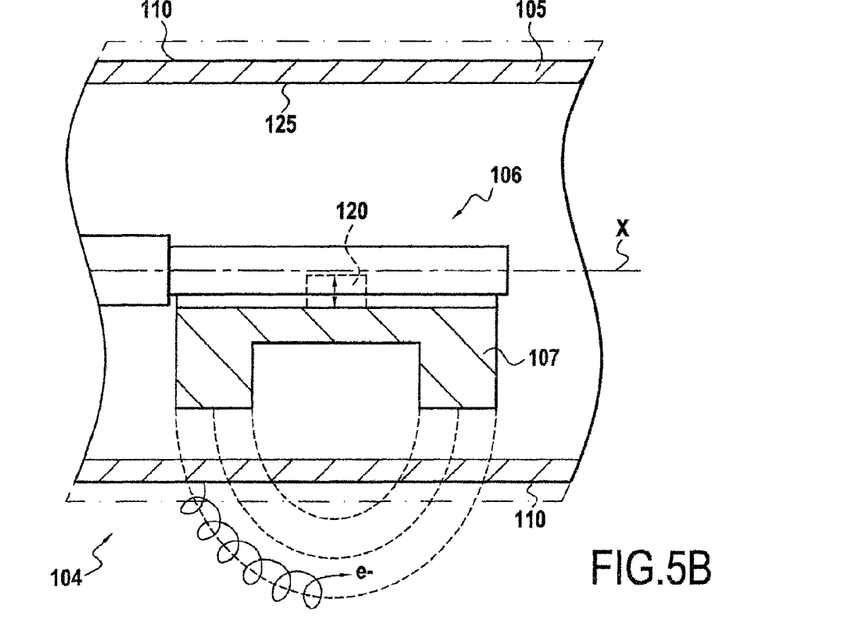
Figure 7:
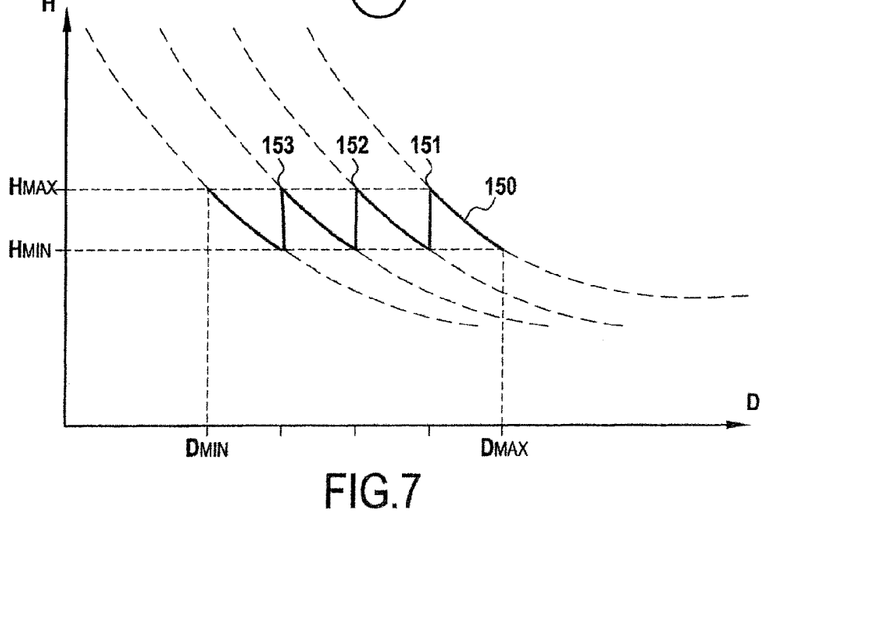
FIG. 7 shows a graph of the magnetic field strength at an outer surface of a rotating tubular target cathode of the first embodiment controlled according to the method of FIG. 6.

As seen in FIGS. 5A and 5B, the position of the magnetic field lines 113 with respect to the surface 110 can thus be substantially the same at different points in time even as the surface 110 erodes. Consequently, the magnetic field strength H at the surface 110 remain for longer within the range between the minimum allowable magnetic field strength $H_{min}$ and a maximum allowable magnetic field strength $H_{max}$, as seen in FIG. 7, as the magnetic field strength H at the surface 110 follows a serrated curve 150, with sudden drops in magnetic field strength H at the points 151, 152, and 153 intercalated between slow increases in magnetic field strength H up to the maximum allowable magnetic field strength $H_{max}$. With these measures, the usable tubular target cathode thickness and range between maximum diameter $D_{max}$ and minimum diameter $D_{min}$ of the tubular target cathode 105 are significantly increased, so that the replacement intervals of the tubular target cathode 105 are extended and its maintenance cost and downtime reduced.

However, alternatively to the stepwise adjustment of the position of the magnet 107, the skilled person can also consider a control method with a continuous adjustment of that position. In particular, the control unit 122 may command a continuous motion of the actuator 120 to maintain the magnetic field strength H at the surface 110 within the range between the minimum magnetic field strength $H_{min}$ and the maximum magnetic field strength $H_{max}$.

Turning back to FIGS. 4A and 4B, a drawback of the spluttering magnetron assembly 104 according to this first embodiment is, however, that in this cross-section, with the movement of the magnet 107 along axis Y, the distances $\Delta r_a$ and $\Delta r_b$ between, respectively, each lateral edge 107A and 107B of the magnet 107 and an inner surface 125 of the tubular target cathode 105 will decrease more slowly than the distance $\Delta r_c$ between the center 107C of the magnet 107 and the inner surface 125. The magnetic field strength H at the surface 110 of the tubular target cathode 105 will thus not be maintained homogeneously across the width of the magnet 107.

Figure 8A:
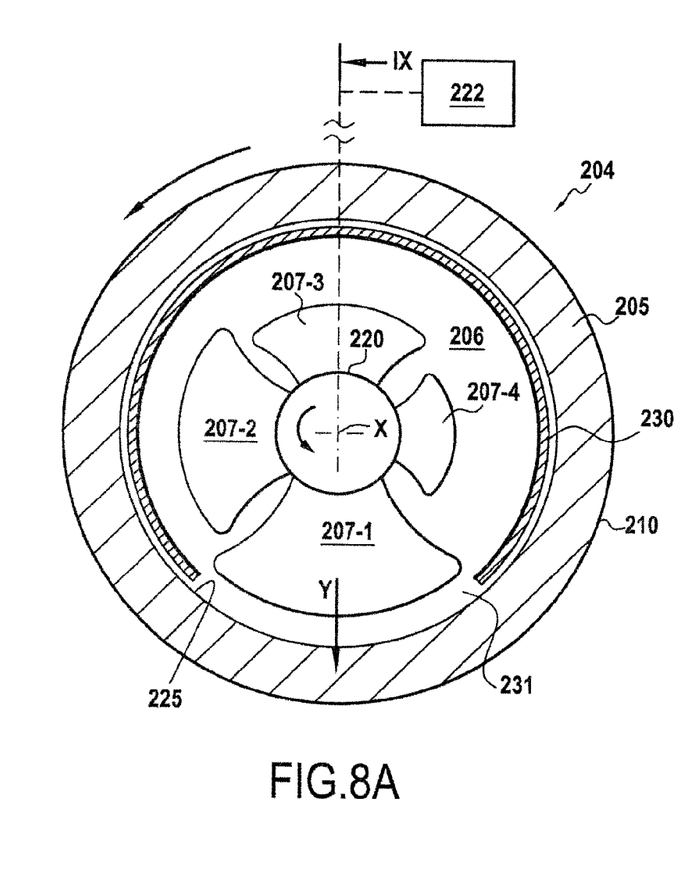
FIGS. 8A and 8B show a schematic cross-section of a sputtering magnetron assembly according to a second embodiment at two different stages in the physical vapor deposition process.
Figure 8B:
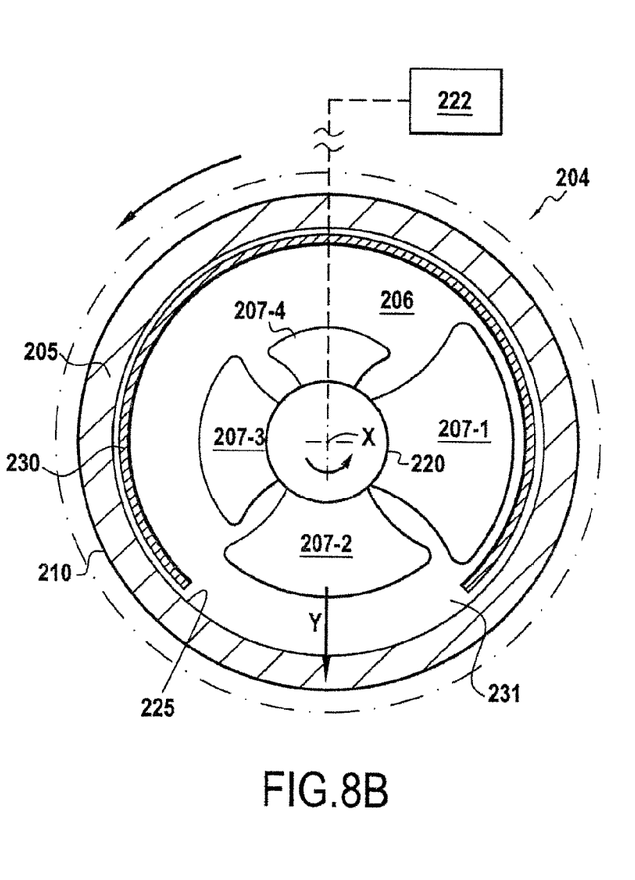

In order to address this drawback, in a second embodiment, as first illustrated in FIG. 8A, the sputtering magnetron assembly 204 also comprises a sacrificial tubular target cathode 205 and, within this tubular target cathode 205, a magnetic field generating device 206. However, in this second embodiment, the magnetic field generating device 206 comprises a plurality of magnets 207-1, 207-2, 207-3 and 207-4 radially arranged around the main axis X of the tubular target cathode 205, and a magnetic shield 230 interposed between the plurality of magnets 207-1, 207-2, 207-3 and 207-4 and an inner surface 225 of the target cathode 205. A rotational actuator 220 coupled to the plurality of magnets 207-1, 207-2, 207-3 and 207-4, and connected to a control unit 222, is commanded by this control unit 222 to rotate the plurality of magnets 207-1, 207-2, 207-3 and 207-4 stepwise around axis X so as to successively align with a window 231 in said magnetic shield 230 different magnets of the plurality of magnets 207-1, 207-2, 207-3 and 207-4, as shown in FIG. 8B.

Figure 9A:
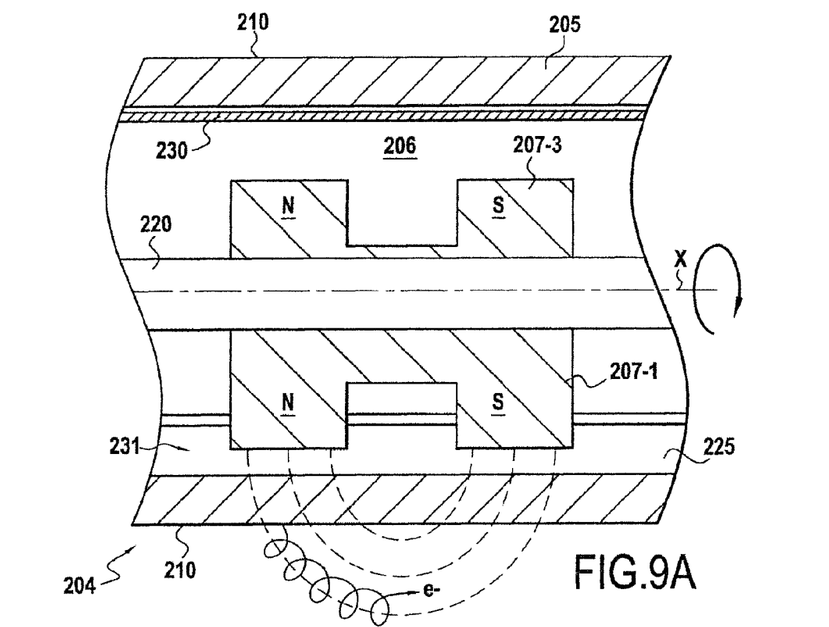
FIGS. 9A and 9B show a schematic partial longitudinal section, along line VII, of the sputtering magnetron assembly according to the second embodiment, in the positions, respectively, of FIG. 8A and FIG. 8B.
Figure 9B:
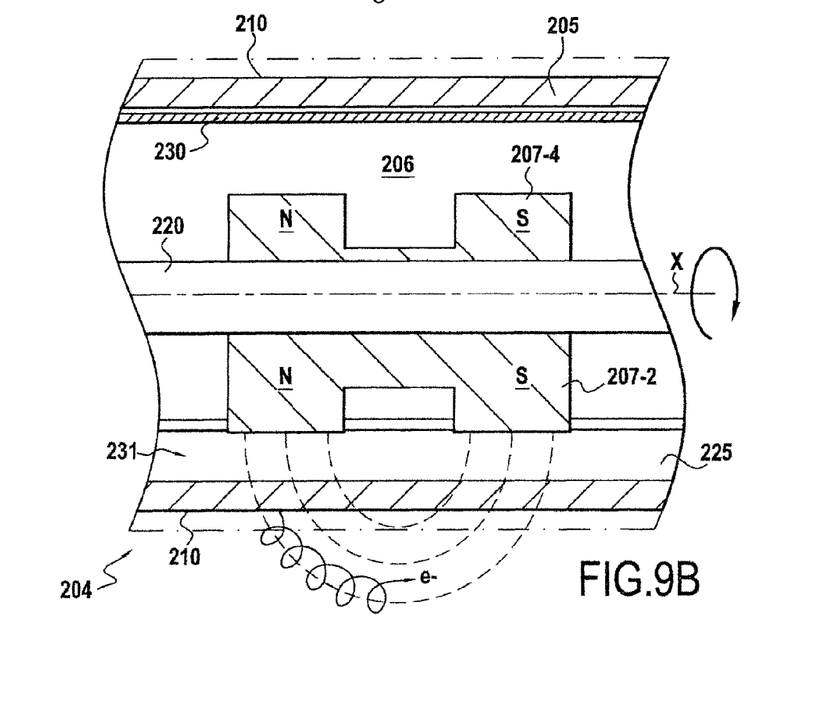

These magnets 207-1, 207-2, 207-3 and 207-4 have substantially the same magnetic moment, but are arranged at decreasing radial distances from axis X, so that, as shown in FIGS. 9A and 9B, their successive alignment with the window 231 has an effect on the magnetic field strength H at the surface 210 analogous to that of the inward radial movement of the magnet 107 in the first embodiment. However, as shown, the magnets 207-1, 207-2, 207-3 and 207-4 can be shaped such that the distance Δr between each individual magnet and the inner surface 225 of the tubular target cathode 205 is substantially constant across the entire width of the magnet.

Figure 10:
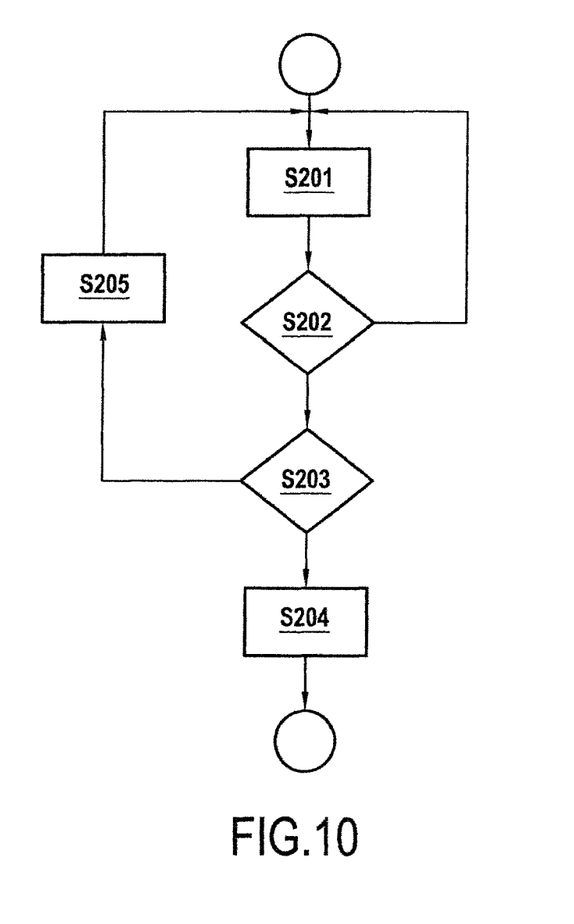
FIG. 10 shows a flowchart of a method for controlling the sputtering magnetron assemblies of the second embodiment.

The method by which the control unit 222 commands the rotational actuator 220 is illustrated by the flowchart of FIG. 10. As in the first embodiment, in a first step S201, the magnetic field strength H at the outer surface 210 of the cathode 205 is estimated, and, in the next step S202, compared with the maximum allowable magnetic field strength $H_{max}$. If the magnetic field strength H is lower than the maximum allowable magnetic field strength $H_{max}$, the control unit 222 also loops back to the first step S201. If the magnetic field strength H is equal to or higher than said maximum allowable magnetic field strength $H_{max}$, the next step is step S203 in which, in this embodiment, it is checked whether the next magnet in the direction of rotation of the actuator 220 is closer to the central axis X than the magnet currently aligned with the window 231. If not, a signal for replacing the tubular target cathode 205 will be issued in the next step S204, before stopping the PVD process. On the other hand, if the next magnet is closer to the axis X, in step S205 the control unit 222 issues a command to the actuator 220 to rotate the magnets so as to align the next magnet with the window 231. The control unit 222 then loops back to the first step S201.

Consequently, the magnetic field strength H at the surface 210 will follow a serrated curve analogous to that of FIG. 7, with sudden declines in magnetic field strength H at the points intercalated between slow increases in magnetic field strength H up to the maximum allowable magnetic field strength $H_{max}$.

Figure 11A:
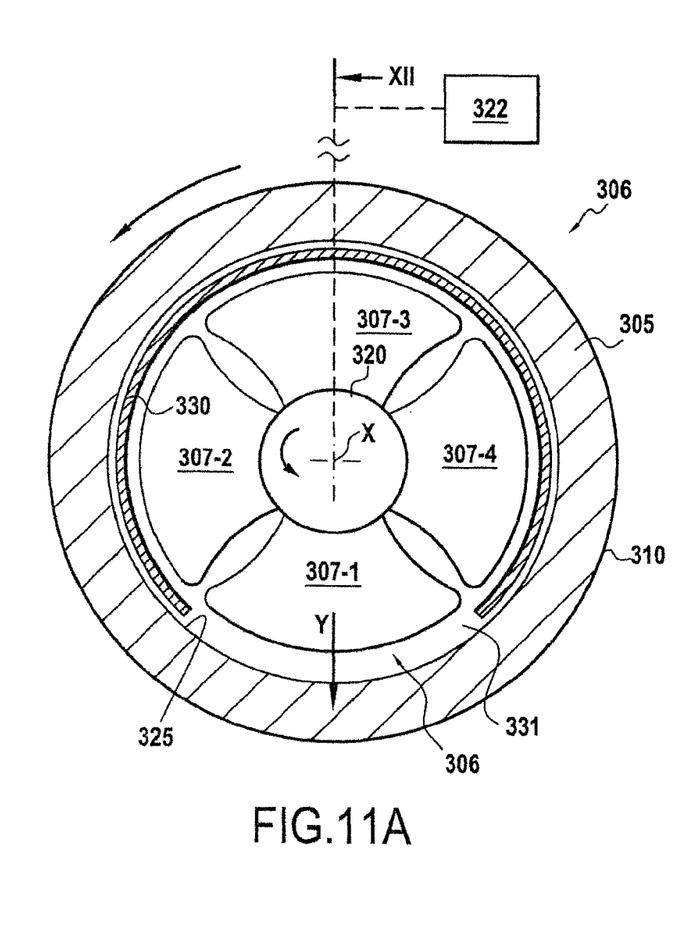
FIGS. 11A and 11B show a schematic cross-section of a sputtering magnetron assembly according to a third embodiment at two different stages in the physical vapor deposition process.
Figure 11B:
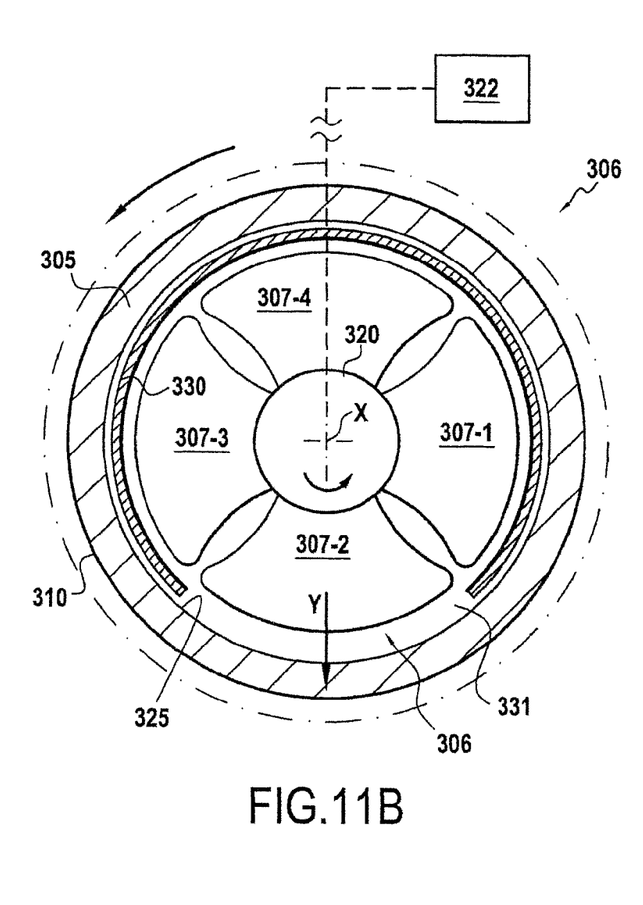

A similar third embodiment is first shown in FIG. 11A. In this third embodiment, the sputtering magnetron assembly 304, which also comprises a sacrificial tubular target cathode 305, also includes, within this tubular target cathode 305, a magnetic field generating device 306 comprising a plurality of magnets 307-1, 307-2, 307-3 and 307-4 radially arranged around the main axis X of the tubular target cathode 305, and a magnetic shield 330 interposed between the plurality of magnets 307-1, 307-2, 307-3 and 307-4 and an inner surface 325 of the target cathode 305. As in the second embodiment, a rotational actuator 320 connected to a control unit 322 rotates the plurality of magnets 307-1, 307-2, 307-3 and 307-4 stepwise around axis X so as to successively align with a window 331 in said magnetic shield 330 different magnets of the plurality of magnets 307-1, 307-2, 307-3 and 307-4, as shown in FIG. 11B.

Figure 12A:
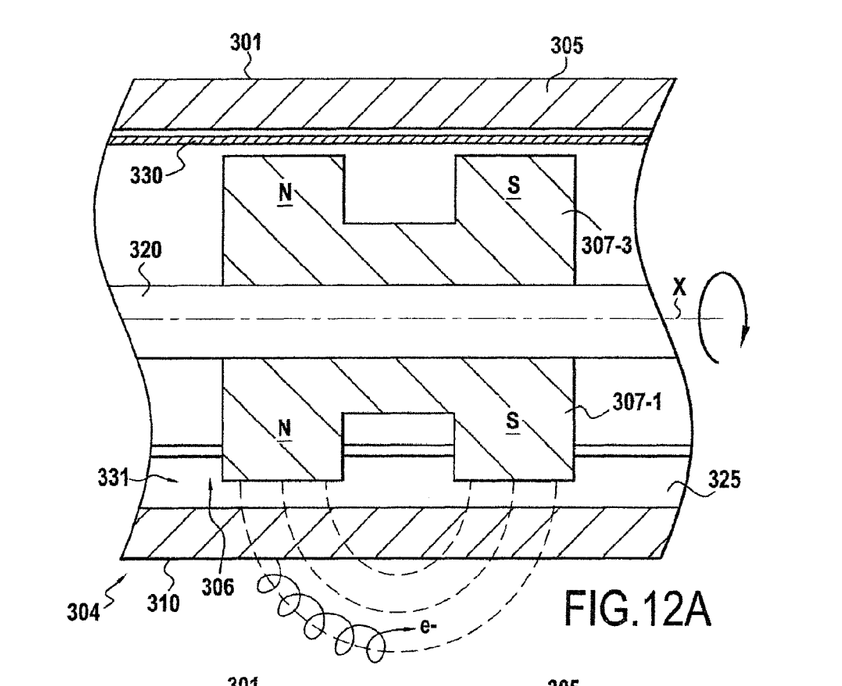
FIGS. 12A and 12B show a schematic partial longitudinal section, along line IX, of the sputtering magnetron assembly according to the first embodiment, in the positions, respectively, of FIG. 11A and FIG. 11B.
Figure 12B:
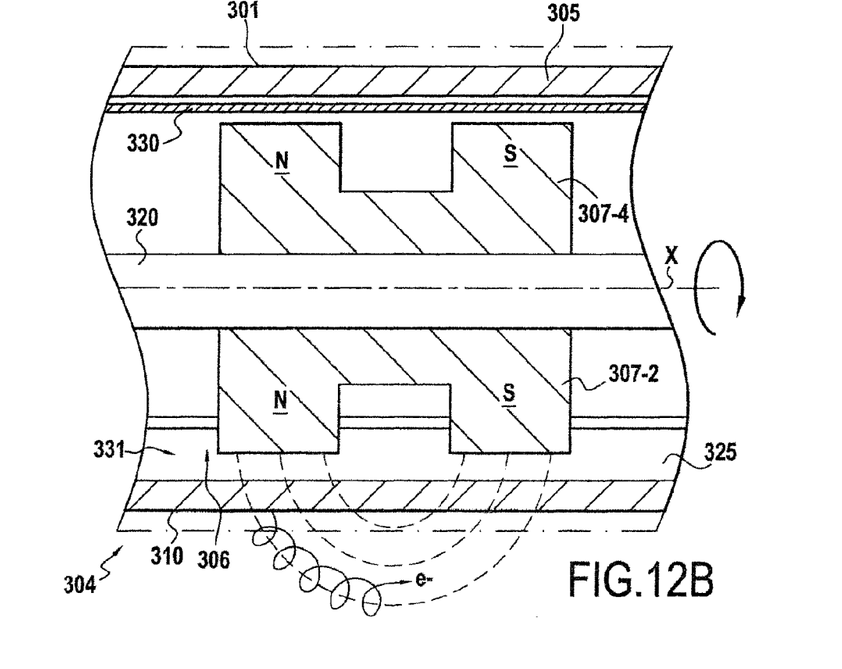

This third embodiment differs from the second embodiment in that the magnets 307-1, 307-2, 307-3 and 307-4, instead of being located at successively decreasing radial distances of the X axis, have magnetic moments of successively decreasing magnitudes. Nevertheless, as shown in the FIGS. 12A and 12B, the rotation of the plurality of magnets 307-1, 307-2, 307-3 and 307-4 to successively align them with the window 331 has a similar effect on the magnetic field strength H at the outer surface 310 of the tubular target cathode 305. Consequently, the method by which the control unit 322 commands the rotational actuator 320 is analogous to that of the second embodiment as illustrated by the flowchart of FIG. 10.

Those skilled in the art will recognize that the present invention may be manifested in a variety of forms other than the specific embodiments described and contemplated herein. In particular, features of more than one of these specific embodiments may be combined into another embodiment: for instance, in another embodiment, the magnetic field generating device may comprise a plurality of magnets with both different magnetic moments and different distances to a rotation axis of the plurality of magnets. The features of the first embodiment may also be combined with features of the second or third embodiments. Accordingly, departure in form and detail may be made without departing from the scope of the present invention as described in the appended claims.

The invention claimed is:

1. A sputtering magnetron assembly comprising:
   a rotatable tubular target cathode;
   a control unit;
   a magnetic field generating device, installed within the tubular target cathode, wherein at least part of the magnetic field generating device is configured to move within the tubular target cathode so as to maintain within a predetermined range a magnetic field strength at an outer surface of the tubular target cathode during erosion of said outer surface, and wherein the magnetic field generating device comprises:
   a plurality of magnets; and
   a magnetic shield interposed between the plurality of magnets and an inner surface of the tubular target cathode, wherein the plurality of magnets and the magnetic shield are configured to move relatively to each other so as to successively align with a window in said magnetic shield different magnets of the plurality of magnets.

2. The sputtering magnetron assembly according to claim 1, wherein the magnets of the plurality of magnets are arranged radially around a center axis and the plurality of magnets is configured to rotate relatively to the magnetic shield so as to successively align with the window different magnets of the plurality of magnets.

3. The sputtering magnetron assembly according to claim 1, wherein magnets of the plurality of magnets are at different distances from a center axis of the tubular target cathode.

4. The sputtering magnetron assembly according to claim 1, wherein magnets of the plurality of magnets have magnetic moments of different magnitudes.

5. A physical vapor deposition process using a sputtering magnetron assembly comprising a rotatable tubular target cathode and, within the tubular target cathode, a magnetic field generating device, wherein at least part of the magnetic field generating device moves within the tubular target cathode to maintain within a predetermined range a magnetic field strength at an outer surface of the target cathode during erosion of said outer surface, and
   wherein the magnetic field generating device comprises a plurality of magnets and a magnetic shield interposed between the plurality of magnets and an inner surface of the target cathode, the plurality of magnets and the magnetic shield moving relatively to each other so as to successively align with a window in said magnetic shield different magnets of said plurality of magnets.

6. The physical vapor deposition process according to claim 5, wherein the magnets of the plurality of magnets are arranged radially around a center axis and the plurality of magnets rotates relatively to the magnetic shield so as to successively align with the window different magnets of said plurality of magnets.

7. The physical vapor deposition process according to claim 5, wherein magnets of said plurality of magnets are at different distances from a center axis of the tubular target cathode.

8. The physical vapor deposition process according to claim 5, wherein magnets of said plurality of magnets have magnetic moments of different magnitudes.

\* \* \* \* \*